US009500677B2

(12) United States Patent
Waldo et al.

(10) Patent No.: US 9,500,677 B2
(45) Date of Patent: Nov. 22, 2016

(54) APPARATUS AND METHOD FOR PROVIDING FREQUENCY DOMAIN DISPLAY WITH VISUAL INDICATION OF FFT WINDOW SHAPE

(75) Inventors: Gary J. Waldo, Hillsboro, OR (US); Kenneth P. Dobyns, Beaverton, OR (US)

(73) Assignee: TEKTRONIK, INC., Beaverton, OR (US)

( * ) Notice: Subject to any disclaimer, the term of this patent is extended or adjusted under 35 U.S.C. 154(b) by 424 days.

(21) Appl. No.: 13/411,328

(22) Filed: Mar. 2, 2012

(65) Prior Publication Data

US 2013/0044112 A1 Feb. 21, 2013

Related U.S. Application Data

(60) Provisional application No. 61/525,620, filed on Aug. 19, 2011.

(51) Int. Cl.
*G06T 11/20* (2006.01)
*G01R 13/02* (2006.01)

(52) U.S. Cl.
CPC ......... *G01R 13/0236* (2013.01); *G01R 13/029* (2013.01)

(58) Field of Classification Search
None
See application file for complete search history.

(56) References Cited

U.S. PATENT DOCUMENTS

| 7,650,589 | B2 * | 1/2010 | Cifra | 717/105 |
| 2002/0183948 | A1 * | 12/2002 | Qian et al. | 702/75 |
| 2006/0229047 | A1 * | 10/2006 | Petchenev et al. | 455/255 |
| 2010/0153044 | A1 * | 6/2010 | Nara | 702/76 |
| 2010/0262377 | A1 * | 10/2010 | Jensen | 702/19 |
| 2012/0243707 | A1 * | 9/2012 | Bradley et al. | 381/98 |

FOREIGN PATENT DOCUMENTS

| EP | 1111396 A2 | 6/2001 |
| EP | 2096451 A1 | 9/2009 |

OTHER PUBLICATIONS

Anonymous: "Anritsu Application Note: Time Domain Measurements Using Vector Network Analyzers", Mar. 2009, pp. 1-20, XP002687500, retrieved from the Internet: URL:///downloadfile.anritsu.com/RefFiles/en-US/Services-Support/Downloads/Application-Notes/Application-Note/11410-00206.pdf. Retrieved on Nov. 15, 2012.
European Search Report and Written Opinion for Application No. 12181087.3, dated Nov. 20, 2012, 7 pages.

* cited by examiner

*Primary Examiner* — James A Thompson
*Assistant Examiner* — Xilin Guo
(74) *Attorney, Agent, or Firm* — Marger Johnson

(57) ABSTRACT

A test and measurement instrument includes a display having a time domain graticule and a frequency domain graticule. A processor is configured to process an input signal to generate a time domain waveform for display in the time domain graticule, the input signal being correlated to a time base. The processor is also configured to process a second input signal and generate a frequency domain waveform for display in the frequency domain graticule, the second input signal being correlated to the same time base. The frequency domain waveform is correlated to a selected time period of the time base. The processor is also configured to generate a spectrum time indicator configured to graphically illustrate a transform parameter, a location and the selected time period in the time domain graticule with respect to the frequency domain waveform.

11 Claims, 5 Drawing Sheets

APPARATUS AND METHOD FOR PROVIDING FREQUENCY DOMAIN DISPLAY WITH VISUAL INDICATION OF FFT WINDOW SHAPE

CROSS-REFERENCE TO PRIOR FILED APPLICATIONS

This application claims priority to earlier filed U.S. provisional application No. 61/525,620 filed 19 Aug. 2011, which is incorporated herein in its entirety. This application is also related to concurrently filed U.S. patent application Ser. No. 13/403,309, Filed 23 Feb. 2012, entitled: Apparatus and Method for Time Correlated Signal Acquisition and Viewing which is incorporated herein in its entirety.

FIELD OF INVENTION

This invention relates to the field of test and measurement instruments and in particular test and measurement instruments configured for viewing of digitized waveforms in the frequency domain.

BACKGROUND

Modern digital oscilloscopes generally provide the capability to generate a time domain waveform of a given input signal. Some instruments may include the capability to generate a spectrum or frequency domain display of the input signal. A digital processor within the oscilloscope generally performs a frequency domain transform on the input signal to generate a frequency domain waveform. A variety of transform parameters may be used to generate the frequency domain waveform. As these transform parameters are adjusted, the corresponding frequency domain waveform may be altered. Existing devices lack an effective way to reflect the transform parameters used to generate the frequency domain waveform. Accordingly, there exists a need for a test and measurement instrument including such capabilities.

SUMMARY OF THE INVENTION

A test and measurement instrument and method are disclosed. The test and measurement instrument includes a display having a time domain graticule and a frequency domain graticule. A processor is configured to process an input signal to generate a time domain waveform for display in the time domain graticule, the input signal being correlated to a time base. The processor is also configured to process a second input signal and generate a frequency domain waveform for display in the frequency domain graticule, the second input signal being correlated to the same time base. The frequency domain waveform is correlated to a selected time period of the time base. The processor is also configured to generate a spectrum time indicator configured to graphically illustrate a transform parameter, a location and the selected time period in the time domain graticule with respect to the frequency domain waveform.

The first input signal and the second input signal may be the same signal. The transform parameter may be a transform window type having an associated shape. The test and measurement instrument may also include an input control configured to select the window type based from a plurality of window types. The spectrum time indicator may have a width that indicates the selected time period of the time domain graticule with respect to the frequency domain waveform. The test and measurement instrument may include an input configured to receive the input signal and a plurality of user controls.

DETAILED DESCRIPTION OF THE INVENTION

The disclosure is directed to test and measurement instruments configured for viewing of digitized waveforms in the frequency domain. Time correlated acquisition and viewing of analog, digital, and RF signals may be accomplished in a single instrument. This is done by splitting the display into two graticules, one for time domain waveforms and one for frequency domain waveforms. The user is provided with indicia that indicate the time period in the time domain from which the spectrum (frequency domain) wave form is calculated. The user is also provided with indicia that graphically illustrate how the frequency domain waveform was generated.

Figure 1:
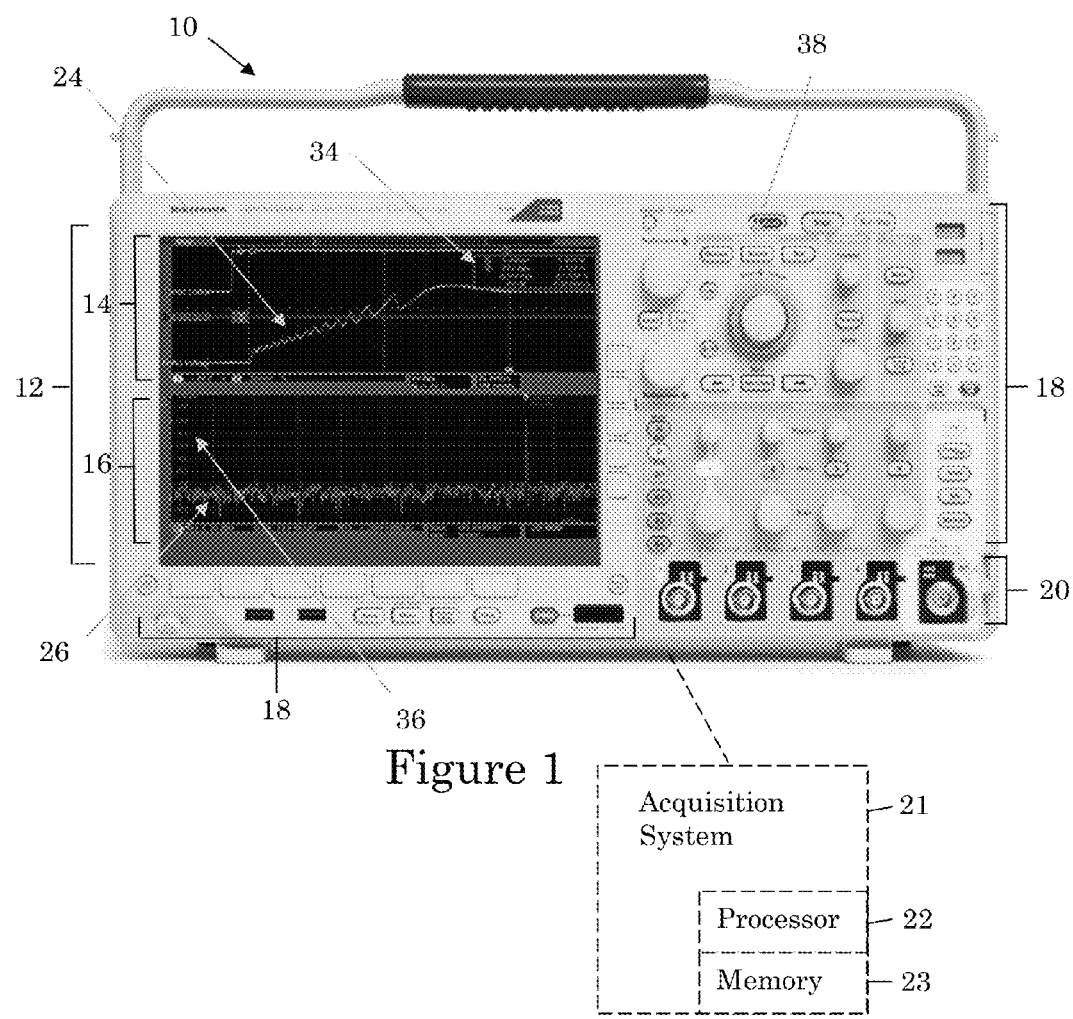
FIG. 1 is a diagram of an oscilloscope having a display that is divided into a plurality of graticules.

FIG. 1 is a diagram of an oscilloscope 10 having a display 12 that is divided into a plurality of graticules 14, 16. The graticules 14, 16 are configured to graphically display at least one waveform 24, 26 and other graphical indicia 34, 36 for example axes, graphical information and text. The oscilloscope 10 also has a plurality of user controls 18 configured for user input and a plurality of electrical inputs 20 configured to receive test signals and the like. User controls 18 may include one or more user inputs configured to select spectrum position, spectrum time and/or FFT window shape as disclosed in detail below.

In this example, the oscilloscope 10 is implemented as a stand-alone unit with an acquisition system 21 including a processor 22 having an associated memory 23 configured for storage of program information and data. It should be understood that processor 22 may be coupled to additional circuitry, e.g., I/O, A/D, graphics generation hardware and the like. The processor 22 is configured to receive at least a portion of the inputs via the user controls 18. The processor is also configured to generate at least a portion of the information displayed in the graticules 14, 16. It should be understood that the oscilloscope may be implemented using a variety of hardware and software including embodiments implemented using a computing devices, e.g., desktop, laptop, tablet, smart phone or other computing devices.

The following definitions may be helpful in understanding this disclosure:

Spectrum time: the amount of time required to calculate the frequency domain waveform displayed in the frequency domain graticule.

Spectrum position: the starting location of the spectrum time relative to the time domain waveform in the time domain graticule.

FFT Window: a mathematical function applied to the time domain data to account for discontinuities at either end of a time domain acquisition. There are many types of FFT Windows with some being better for some types of RF measurements and others being better for other types of RF measurements, but each one will have a different impact on what the resulting frequency domain waveform looks like.

Figure 2:
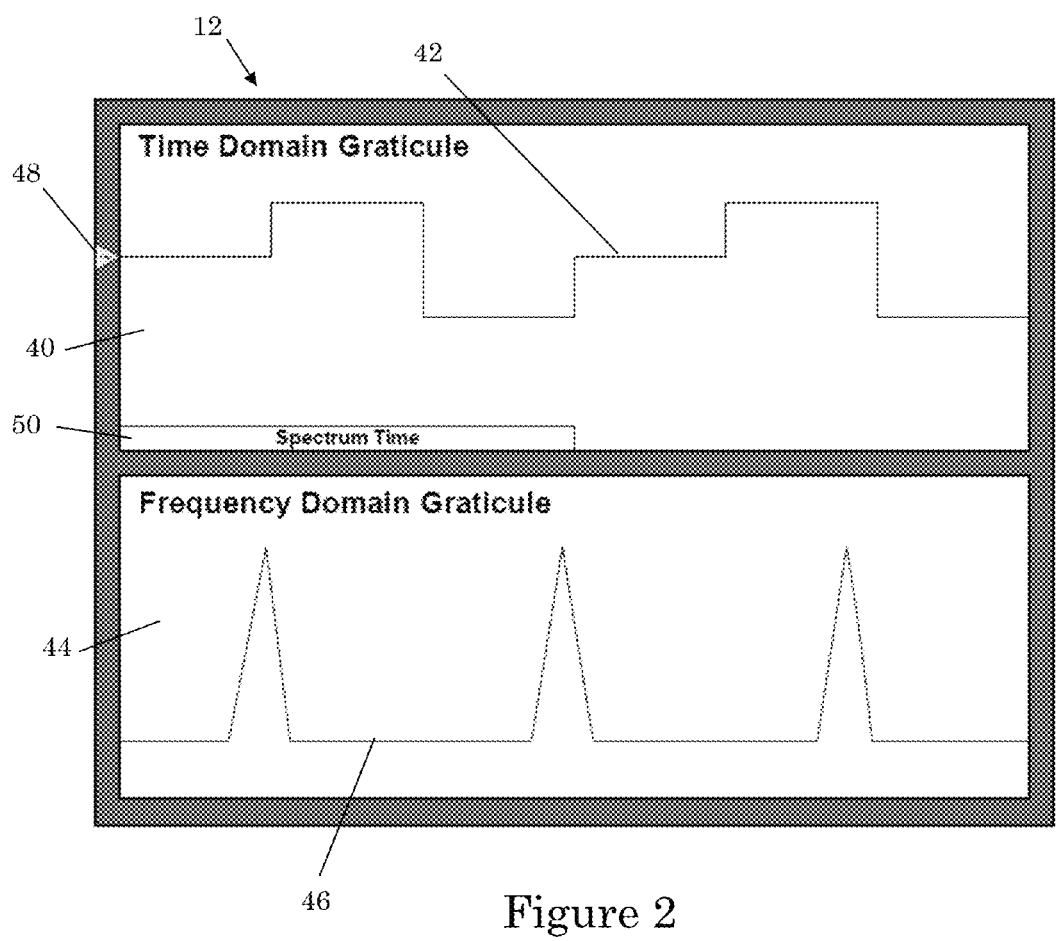
FIG. 2 is a block diagram of a display configured to display time domain and frequency domain waveforms and a spectrum time indicator.
Figure 3:
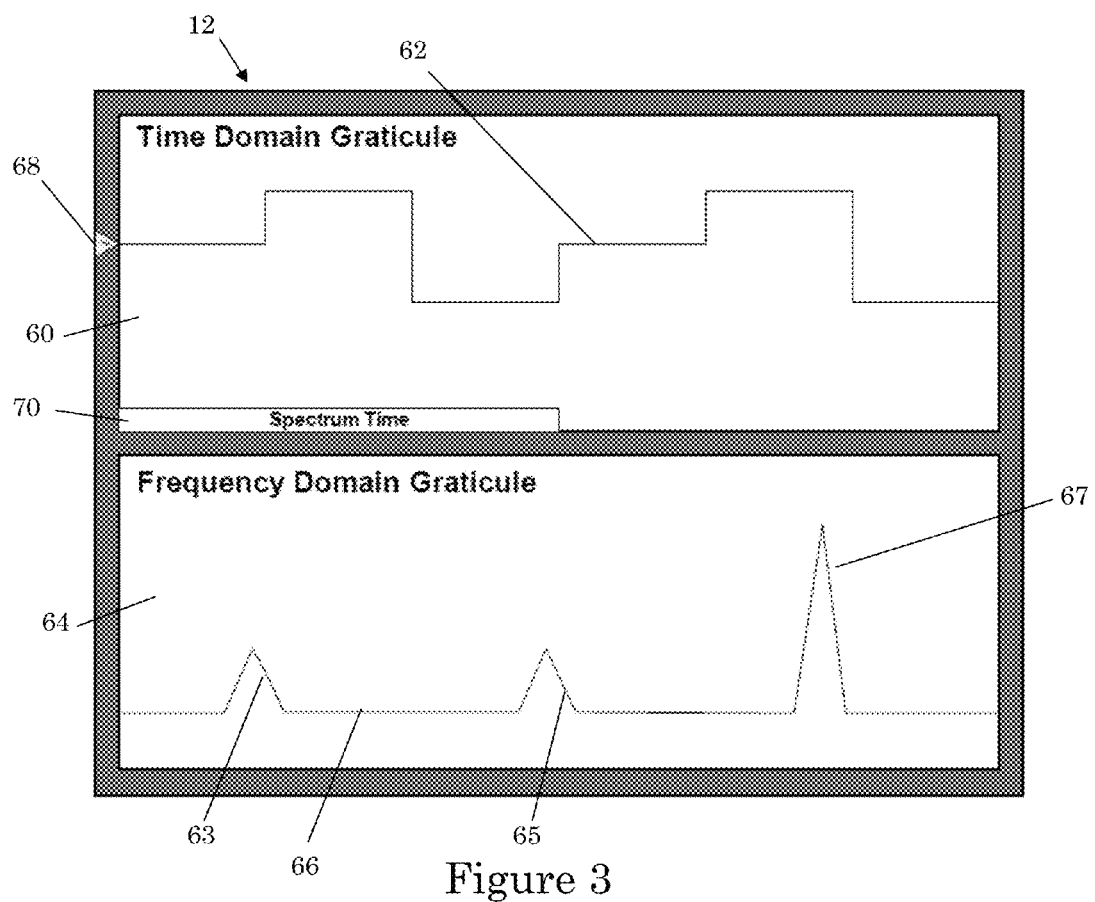
FIG. 3 is a block diagram of a display configured to display time domain and frequency domain waveforms and a spectrum time indicator.
Figure 4:
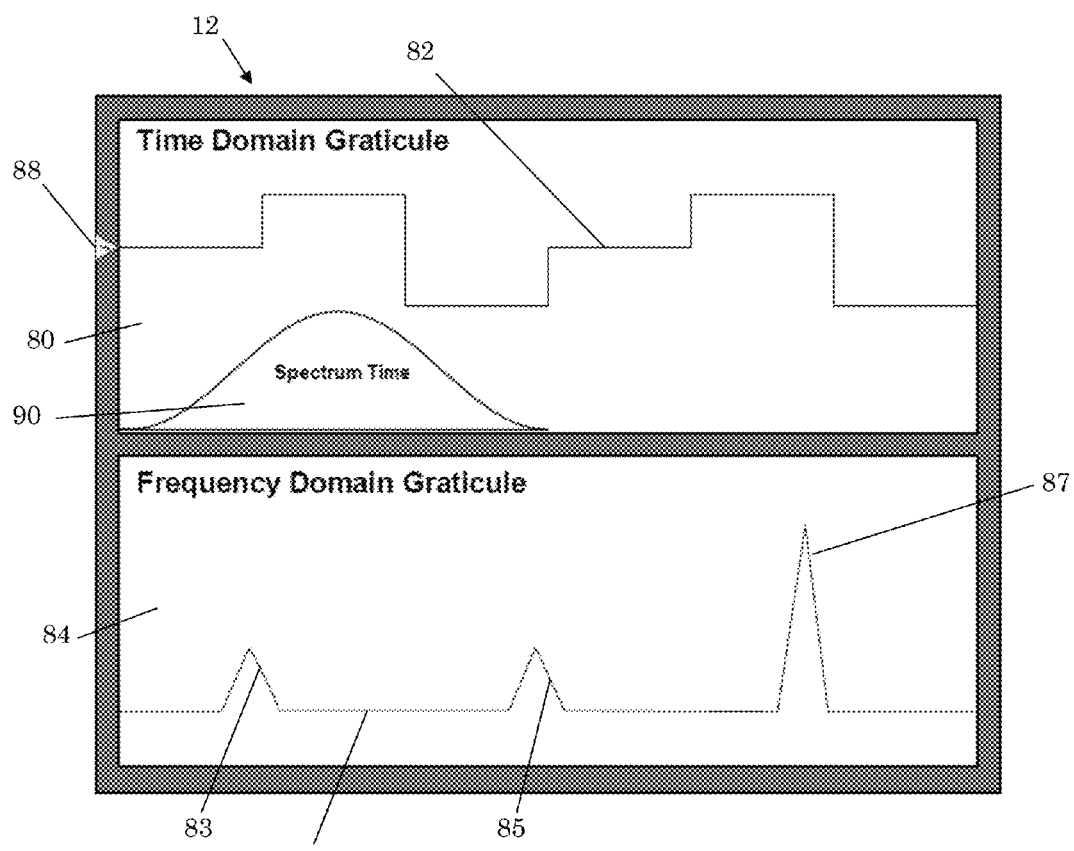
FIG. 4 is a block diagram of a display configured to display both time domain and frequency domain waveforms and a spectrum time indicator showing FFT window shape.

FIGS. 2-4 are examples showing a display configured to display both time domain and frequency domain waveforms. For matters of simplicity, the input signal is a constant power, frequency hopping signal that's continuously transitioning through three unique frequencies. This signal is acquired by a mixed domain oscilloscope, e.g., as shown in FIG. 1, that has both time and frequency domain displays of the same signal simultaneously. It should be understood that different input signals may be used to generate the time domain waveform and frequency domain waveform.

FIG. 2 is a diagram of a display 12 that is divided into a plurality of graticules. In this example, the upper graticule is a time domain graticule 40 that is configured to display a time domain waveform 42 (frequency vs. time) representing a time domain signal supplied to one of electrical inputs 20. It should be understood that a variety of other time domain waveforms may be generated without departing from the scope of this disclosure, e.g., amplitude vs. time. The display 12 may also include a center frequency indicator 48 configured to indicate the location of center frequency in the frequency domain graticule 44 within the Frequency vs. Time waveform 42 presented in the time domain graticule 40. In this example, points above the center frequency indicator 48 are a higher frequency; points below the center frequency indicator 48 are a lower frequency. Moving left to right, the time domain waveform starts at a middle frequency, moves to a higher frequency, moves to a lower frequency, moves back to the middle frequency, then the higher frequency and finally back to the lower frequency. It should be understood that the display 12 may be configured to simultaneously display several individual time domain waveforms from separate signals applied to electrical inputs 20.

The lower graticule is a frequency domain graticule 44 that is configured to display a frequency domain waveform 46 from a signal applied to one of electrical inputs 20 for at least a portion of the time represented in the time domain graticule 40. The display 12 also includes a simple spectrum time indicator 50 configured to graphically indicate the time period used to generate the frequency domain waveform 46. With spectrum time indicator 50 positioned as shown in the time domain graticule 40, the user would assume that the frequency domain waveform 46 would be as shown. During the spectrum time, the signal transitioned through three different frequencies spending the same amount of time at each one. However, what the user actually sees is shown in FIG. 3.

FIG. 3 shows a display 12 having a time domain graticule 60 configured to display a time domain waveform 62 (frequency vs. time) representing a time domain signal supplied to one of electrical inputs 20. The display 12 also has a frequency domain graticule 64 that is configured to display a frequency domain waveform 66 from a signal applied to one of electrical inputs 20 for at least a portion of the time represented in the time domain graticule 60. The display 12 may also include a center frequency indicator 68 configured to indicate the location of center frequency in the frequency domain graticule 64 within the Frequency vs. Time waveform 62 presented in the time domain graticule 60. The display 12 includes a simple spectrum time indicator 70 configured to graphically indicate the time period used to generate the frequency domain waveform 66.

Looking at the time domain waveform 62, it is not readily apparent why the frequency domain waveform 66 is displayed as shown. Only the high frequency peak 67 has high amplitude. The lower frequency peaks 63, 65 have a lower amplitude, despite the signal spending the same amount of time at all three frequencies as indicated in the time domain graticule 60. This is due to the specific transform parameter(s), e.g., FFT window shape, used to generate the frequency domain waveform 66.

FIG. 4 shows an enhanced display 12 having a time domain graticule 80 configured to display a time domain waveform 82 (frequency vs. time) representing a time domain signal supplied to one of electrical inputs 20. The display 12 also has a frequency domain graticule 84 that is configured to display a frequency domain waveform 86 from a signal applied to one of electrical inputs 20 for at least a portion of the time represented in the time domain graticule 80. The display 12 may also include a center frequency indicator 88 configured to indicate the location of center frequency in the frequency domain graticule 84 within the Frequency vs. Time waveform 82 presented in the time domain graticule 80. The display 12 includes a spectrum time indicator 90 configured to graphically indicate the time period and FFT window shape used to generate the frequency domain waveform 86.

Looking at the time domain waveform 82, it is now readily apparent why the frequency domain waveform 86 is displayed as shown. The high frequency peak 87 has high amplitude because the time spent at the high frequency was in the middle of the FFT window and wasn't attenuated as much as the edges. The time spent at the middle and low frequencies 83, 85 is reduced by the shape of the FFT Window function used to generate the spectrum. The spectrum time indicator 90 graphically illustrates the FFT window shape in addition to its position in time to aid the user's understanding of the corresponding spectrum display.

It should be understood that a variety of FFT window shapes may be used without departing from the scope of this disclosure. For example the FFT window shape may be generally Gaussian as shown in FIG. 4 or may be Rectangular, Triangular, Hanning, Hamming, Poisson, Cauchy, Kaiser-Bessel as well as others.

Figure 5:
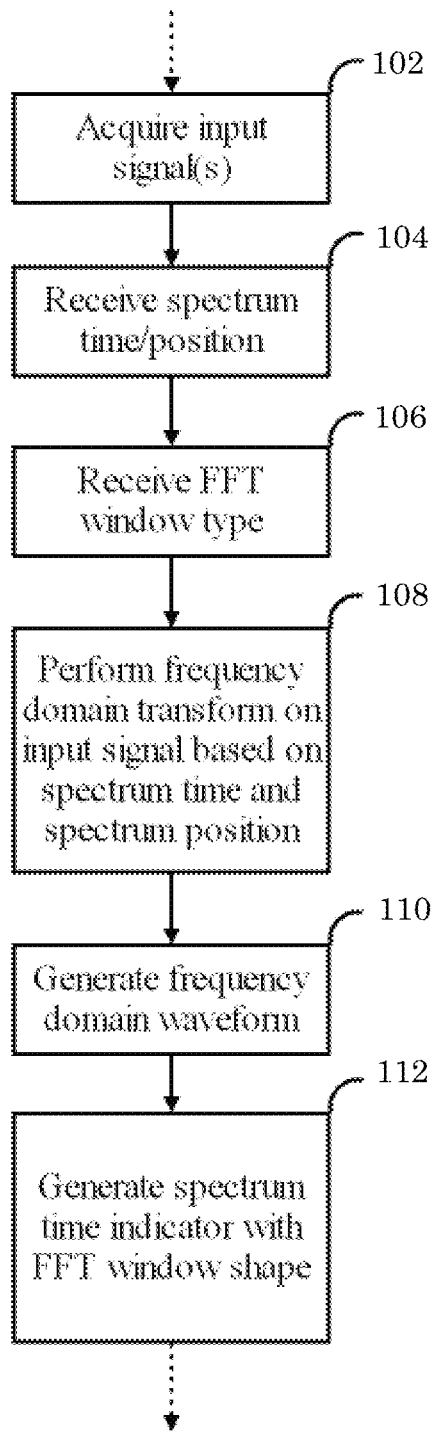
FIG. 5 is a flowchart showing the general processing steps to generate a frequency domain waveform and spectrum time indicator.

FIG. 5 is a flowchart showing the general processing steps to carry out the functions disclosed above. It should be understood that any flowcharts contained herein are illustrative only and that other program entry and exit points, time out functions, error checking routines and the like (not shown) would normally be implemented in typical system software. It is also understood that system software may run continuously after being launched. Accordingly, any beginning and ending points are intended to indicate logical beginning and ending points of a portion of code that can be integrated into a main program and executed as needed. The order of execution of any of the blocks may also be varied without departing from the scope of this disclosure. Implementation of these aspects is readily apparent and well within the grasp of those skilled in the art based on the disclosure herein.

One or more input signals are acquired, e.g., digitized and stored in memory, as shown by block 102. The digitized input signal(s) generally include a series of samples having a known time base. The spectrum time and spectrum position are determined as shown by block 104. The FFT window shape is determined as shown by block 106. Spectrum time, position and FFT window shape may be received via front panel controls 38 shown in FIG. 1. It should be understood that the spectrum time, spectrum position and FFT window shape may be set to initial default values if no user input is received.

The processor performs a frequency domain transform, e.g., fast Fourier transform (FFT), on the input signal. The spectrum time and spectrum position inputs are used to identify corresponding input signal samples for this time period as shown by block 108. A frequency domain waveform is generated as shown by block 110. The spectrum time indicator is then generated with a shape corresponding to the selected FFT window type. The spectrum time indicator is then overlaid on the display to graphically represent the spectrum time, spectrum position and FFT window type as shown by block 112.

It should be understood that many variations are possible based on the disclosure herein. Although features and elements are described above in particular combinations, each feature or element can be used alone without the other features and elements or in various combinations with or without other features and elements. The methods or flow charts provided herein may be implemented in a computer program, software, or firmware incorporated in a computer-readable (non-transitory) storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A test and measurement instrument, comprising:
   a display having a time domain graticule and a frequency domain graticule;
   a processor configured to process an input signal to display a time domain waveform of the input signal in the time domain graticule, the input signal being correlated to a time base, the processor being configured to process the input signal and display a frequency domain waveform of the input signal in the frequency domain graticule, the frequency domain waveform being correlated to a selected time period of the time base;
   the processor being configured to generate a spectrum time indicator configured to graphically illustrate a fast Fourier transform (FFT) window shape of the FFT window type used to generate the frequency domain waveform and the selected time period associated with the frequency domain waveform, wherein the frequency domain waveform is a spectrum waveform;
   the display being configured to display, in the time domain graticule with the time domain waveform, the FFT window shape graphically illustrating a mathematical function applied to the time domain waveform to account for discontinuities during time domain acquisition and resulting in the frequency domain waveform displayed in the frequency domain graticule.

2. The test and measurement instrument of claim 1 further comprising an input control configured to select the FFT window type based from a plurality of FFT window types.

3. The test and measurement instrument of claim 1, wherein the spectrum time indicator has a width that indicates the selected time period of the time domain graticule with respect to the frequency domain waveform.

4. The test and measurement instrument of claim 1, further comprising an input configured to receive the input signal.

5. The test and measurement instrument of claim 1, further comprising a plurality of user controls.

6. A method of providing a test and measurement instrument, the method comprising:
   providing a display having a time domain graticule and a frequency domain graticule;
   providing a processor configured to process an input signal to display a time domain waveform of the input signal in the time domain graticule, the input signal being correlated to a time base, the processor being configured to process the input signal and display a frequency domain waveform of the input signal in the frequency domain graticule, the frequency domain waveform being correlated to a selected time period of the time base;
   the processor being configured to generate a spectrum time indicator configured to graphically illustrate a fast Fourier transform (FFT) window shape of the FFT window type used to generate the frequency domain waveform and the selected time period associated with the frequency domain waveform, wherein the frequency domain waveform is a spectrum waveform,
   employing the display to display, in the time domain graticule with the time domain waveform, the FFT window shape graphically illustrating a mathematical function applied to the time domain waveform to account for discontinuities during time domain acquisition and resulting in the frequency domain waveform displayed in the frequency domain graticule.

7. The method of claim 6, further comprising receiving an input control to select the FFT window type based from a plurality of FFT window types.

8. The method of claim 6, wherein the spectrum time indicator has a width that indicates the selected time period of the time domain waveform with respect to the frequency domain waveform.

9. A method implemented in a test and measurement instrument, the method comprising:
   acquiring an input signal in a time domain as a time domain waveform, the input signal being correlated to a time base;
   acquiring a selected time period of the time base associated with a frequency domain waveform of the input signal;
   receiving, via controls, a fast Fourier transform (FFT) window shape;
   applying a mathematical function corresponding to the FFT window shape to the time domain waveform to account for discontinuities during time domain acquisition, the application of the mathematical function resulting in the frequency domain waveform of the input signal;

displaying the frequency domain waveform of the input signal in a frequency domain graticule;

displaying the time domain waveform of the input signal in a time domain graticule;

generating a spectrum time indicator configured to graphically illustrate the FFT window shape used to generate the frequency domain waveform and the selected time period associated with the frequency domain waveform, wherein the frequency domain waveform is a spectrum waveform;

displaying, in the time domain graticule with the time domain waveform, the FFT window shape to graphically illustrate the mathematical function applied to the time domain waveform resulting in the frequency domain waveform displayed in the frequency domain graticule.

10. The method of claim 9, further comprising displaying a center frequency indicator in the time domain graticule to indicate a location of center frequency in the frequency domain graticule.

11. The method of claim 9, wherein the FFT window shape is Rectangular, Triangular, Hanning, Hamming, Poisson, Cauchy, or Kaiser-Bessel.

* * * * *